United States Patent

Takahashi et al.

[11] Patent Number: 6,123,867
[45] Date of Patent: Sep. 26, 2000

[54] PIEZOELECTRIC CERAMIC COMPOSITION AND PIEZOELECTRIC DEVICE USING THE SAME

[75] Inventors: Keiichi Takahashi; Masamitsu Nishida; Hiroshi Asano, all of Osaka; Hiroyuki Hase, Kyoto, all of Japan

[73] Assignee: Matsushita Electric Industrial Co., Ltd., Osaka, Japan

[21] Appl. No.: 09/203,134

[22] Filed: Dec. 1, 1998

[30] Foreign Application Priority Data

Dec. 3, 1997 [JP] Japan ................................. 9-333261
Dec. 8, 1997 [JP] Japan ................................. 9-337364
Apr. 7, 1998 [JP] Japan ................................ 10-094886

[51] Int. Cl.[7] ..................... C04B 35/493; H01L 41/187

[52] U.S. Cl. ............................ 252/62.9 PZ; 561/134; 310/311

[58] Field of Search ................. 252/62.9 PZ; 501/134; 310/311

[56] References Cited

U.S. PATENT DOCUMENTS

| | | | |
|---|---|---|---|
| 3,830,742 | 8/1974 | Nishida et al. | 252/62.9 PZ |
| 3,890,241 | 6/1975 | Nishida et al. | 252/62.9 PZ |
| 4,210,546 | 7/1980 | Ouchi et al. | 252/62.9 PZ |
| 4,392,970 | 7/1983 | Ouchi et al. | 252/62.9 PZ |
| 5,648,012 | 7/1997 | Higashibeppu et al. | 252/62.9 PZ |

FOREIGN PATENT DOCUMENTS

| | | |
|---|---|---|
| 45-23262 | 8/1970 | Japan . |
| 5-17220 | 1/1993 | Japan . |
| 6-333427 | 12/1994 | Japan . |
| 8-12428 | 1/1996 | Japan . |
| 8-231270 | 9/1996 | Japan . |
| 9-142930 | 6/1997 | Japan . |
| 9-235159 | 9/1997 | Japan . |

*Primary Examiner*—C. Melissa Koslow
*Attorney, Agent, or Firm*—Merchant & Gould P.C.

[57] ABSTRACT

A piezoelectric ceramic composition comprises a composite oxide of Pb, Ti and Zr as a main component and Mn and at least one metal element selected from the group consisting of Y, Dy, Er, Ho, Tm, Lu and Yb as subsidiary components. A piezoelectric device comprises such a piezoelectric ceramic composition.

28 Claims, 3 Drawing Sheets

PIEZOELECTRIC CERAMIC COMPOSITION AND PIEZOELECTRIC DEVICE USING THE SAME

BACKGROUND OF THE INVENTION

1. Field of the Invention

The present invention relates to a piezoelectric ceramic composition for use in a ceramic filter, a ceramic oscillator, a piezoelectric transducer, a variety of ceramic sensors, a ceramic buzzer or the like. The present invention also relates to a piezoelectric device such as a piezoelectric ceramic oscillator and a piezoelectric ceramic filter including a capacitive part and a piezoelectric oscillating part using the piezoelectric ceramic composition.

2. Description of the Prior Art

Conventional examples of a piezoelectric ceramic material include so-called PT ceramics comprising $PbTiO_3$ as a main component, so-called PZT ceramics comprising $Pb(Ti, Zr)O_3$ as a main component, and a multi-component piezoelectric ceramic composition comprising several types of composite perovskite compositions such as $Pb(Mg_{1/3}Nb_{2/3})O_3$ and $Pb(Ni_{1/3}Nb_{2/3})O_3$ in the form of a solid solution. The use of these compositions provides a wide range of piezoelectric ceramics varying in the characteristics by selecting a composition ratio of the components suitably to meet a purpose of use. For example, $Pb(Zn_{1/3}Nb_{2/3})_A(Sn_{1/3}Nb_{2/3})_B Ti_C Zr_D O_3$ composition (disclosed in Japanese Patent Publication (Tokko-sho) Nos. 52-17239 and 51-7318) and $Pb(Sn_a Sb_{1-a})_X Ti_Y Zr_Z O_3$ composition (disclosed in Japanese Patent Publication (Tokko-sho) Nos. 54-32516 and 54-36757) are suitable for use in a high frequency ceramic oscillator or filter, because of their excellent piezoelectricity and small size of crystal grains. Therefore, these piezoelectric ceramic compositions are used in ceramic filters, ceramic oscillators, piezoelectric transducers, ceramic sensors or the like.

However, there is a problem when such piezoelectric ceramics are heated to a temperature of about 250° C. for, for example, solder reflow and cooled to room temperature. In this case, the piezoelectric properties such as resonance frequency of the piezoelectric ceramics before the heat treatment are different from those after the heat treatment.

The heat treatment changes the piezoelectric properties including a mechanical quality factor ($Q_m$), an electromechanical coupling coefficient ($k_r$) and a dielectric constant ($\epsilon/\epsilon_0$) of the conventional piezoelectric ceramic compositions. Thus, the conventional piezoelectric ceramic composition has poor heat resistance. In addition, the piezoelectric properties drift due to heat. This change due to thermal shock may lead to a change in the characteristics of the frequency dependence of a filter produced with such piezoelectric ceramics. Japanese Laid-Open Patent Publication (Tokkai-Hei) Nos. 8-239269 and 9-142930 disclose materials that are not affected by heat. More specifically, a composite oxide of Y, Nb or the like is allowed to be a component of the main component of PZT, or Cr is added thereto, so that the resistance of the piezoelectric ceramics becomes low.

When an electronic component such as a ceramic filter and a ceramic oscillator is fabricated as a chip, a chip element is mounted with solder at a higher temperature. The temperature of the element may be about 200° C. When a piezoelectric device formed of a conventional piezoelectric ceramic composition is heated at 150° C. for 1 hour, the resonance frequency fr changes by several % immediately after the heat treatment, when compared to that before the heat treatment. After the heat treatment, the resonance frequency fr changes over time and drifts to a value different from that before the heat treatment. In other words, the characteristics of the conventional piezoelectric ceramic composition change because of poor heat resistance, and drift occurs due to heat. Therefore, the piezoelectric device has low reliability and disadvantages in mass production.

SUMMARY OF THE INVENTION

Therefore, with the foregoing in mind, it is an object of the present invention to provide a PZT piezoelectric ceramic material having improved mass productivity and stability in quality by raising heat resistance against a heat treatment at about 250° C. for a short period and improving thermal drift characteristics, and to provide a piezoelectric ceramic composition and a piezoelectric device using the piezoelectric ceramic composition having excellent heat resistance so that the piezoelectric properties change in only a small amount when the piezoelectric ceramic composition is heated at about 250° C. for a short period and then cooled to room temperature. In particular, another object of the present invention is to provide a piezoelectric device using a piezoelectric ceramic composition that has a strictly controlled composition ratio so that the change in the resonance frequency is small, and the change in the capacitance is significantly small.

A piezoelectric ceramic composition of the present invention comprises a composite oxide including Pb, Ti and Zr as a main component and Mn and at least one metal element selected from the group consisting of Y, Dy, Er, Ho, Tm, Lu and Yb as subsidiary components.

According to another aspect of the present invention, a piezoelectric ceramic composition comprises a composite oxide represented by Formula (I) as a main component:

$$(1-x)Pb(M_{1/3}Nb_{2/3})_a Zr_b Ti_c O_3 - xRMn_d O_{1+2d} \quad (I)$$

where $0<x \leq 0.1$, $0 \leq a \leq 0.1$, $0 \leq b \leq 0.7$, $0.3 \leq c \leq 1.0$, $a+b+c=1$, $0.5 \leq d \leq 3$, M is at least one metal element selected from the group consisting of Zn, Ni and Mg, and R is at least one metal element selected from the group consisting of Y, Dy, Er, Ho, Tm, Lu and Yb.

According to another aspect of the present invention, a piezoelectric ceramic composition comprises a composite oxide including Pb and Ti as a main component, with a metal element R (where R is at least one metal element selected from the group consisting of Y, Dy, Er, Ho, Tm, Lu and Yb) and Mn also being present in the composition. The metal element R and Mn are contained in an amount so that an amount of an oxide of $RMnO_3$ is 1 to 10 mol % with respect to a total amount of the oxide and the composite oxide.

When the metal element R and Mn are added to the composite oxide exhibiting piezoelectricity, the changes of the piezoelectric properties of the piezoelectric ceramic composition due to heat treatment can be reduced. In particular, changes over time in the piezoelectric properties can be made small. When the metal element R and Mn are contained in an amount less than 1 mol %, the effect of the addition of the metal element R and Mn is not sufficient. On the other hand, when the metal elements R and Mn are contained in an amount more than 10 mol %, the piezoelectric properties of the composition may not be sufficient.

According to another aspect of the present invention, a piezoelectric ceramic composition comprises a composite oxide represented by Formula (II) as a main component:

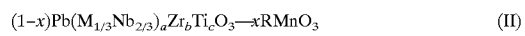

$$(1-x)Pb(M_{1/3}Nb_{2/3})_a Zr_b Ti_c O_3 - xRMnO_3 \quad (II)$$

where $0.01 \leq x \leq 0.1$, $0 \leq a \leq 0.1$, $0 \leq b \leq 0.7$, $0.3 \leq c \leq 1.0$, $a+b+c=1$, M is at least one metal element selected from the group consisting of Zn, Ni and Mg, and R is at least one metal element selected from the group consisting of Y, Dy, Er, Ho, Tm, Lu and Yb.

According to another aspect of the present invention, a piezoelectric ceramic composition comprises a composite oxide represented by Formula (III) as a main component and a metal element R (where R is at least one metal element selected from the group consisting of Y, Dy, Er, Ho, Tm, Lu and Yb) and Mn as subsidiary components:

$$Pb(A, Nb)_x Zr_y Ti_{1-x-y} O_3 \qquad (III)$$

where $0 \leq x \leq 0.05$, $0.35 \leq y \leq 0.80$, and A is at least one metal element selected from the group consisting of Sn, Zn, Ni and Mg. The piezoelectric ceramic composition comprises the metal element R in an amount so that an amount of $R_2O_3$ is 0.01 to 0.05 mol per mol of the main component. The piezoelectric ceramic composition comprises Mn in an amount so that the amount of $Mn_2O_3$ is 0.01 to 0.05 mol per mol of the main component.

According to another aspect of the present invention, a piezoelectric ceramic composition is a composition represented by Formula (IV):

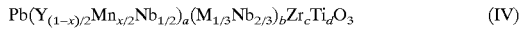

$$Pb(Y_{(1-x)/2} Mn_{x/2} Nb_{1/2})_a (M_{1/3} Nb_{2/3})_b Zr_c Ti_d O_3 \qquad (IV)$$

where $0 \leq x < 1.0$, $0.01 \leq a \leq 0.15$, $0 \leq b < 0.2$, $0 \leq c \leq 0.68$, $0.3 \leq d \leq 0.93$, $a+b+c+d=1$, and M is at least one metal element selected from the group consisting of Zn, Ni and Mg.

In one embodiment of the piezoelectric ceramic composition of the present invention, preferably, the piezoelectric ceramic composition further comprises at least one metal element selected from the group consisting of Fe, Cr, Co, Cu and Sn in an amount so that the amount of each of $Fe_2O_3$, $Cr_2O_3$, CoO, CuO and $SnO_2$ is 0.01 to 1.3wt %.

According to another aspect of the present invention, a method for producing a piezoelectric ceramic composition comprises the steps of adding a subsidiary component $RMnO_3$ (where R is at least one metal element selected from the group consisting of Y, Dy, Er, Ho, Tm, Lu and Yb) that has been calcined earlier to a main component of a composite oxide of Pb, Ti and Zr that has been calcined earlier, mixing the main component and the subsidiary component, and sintering the mixture.

According to another aspect of the present invention, a method for producing a piezoelectric ceramic composition comprises the steps of adding a subsidiary component that has been calcined earlier to a main component that has been calcined earlier, mixing the main component and the subsidiary component, and sintering the mixture. In this method, $RMnO_3$, where R is at least one metal element selected from the group consisting of Y, Dy, Er, Ho, Tm, Lu and Yb, is used as the subsidiary component. The main component is a composite oxide represented by Formula (III):

$$Pb(A, Nb)_x Zr_y Ti_{1-x-y} O_3 \qquad (III)$$

where $0 \leq x \leq 0.05$, $0.35 \leq y \leq 0.80$, and A is at least one metal element selected from the group consisting of Sn, Zn, Ni and Mg. The subsidiary component is added to the main component in an amount so that the amount of $R_2O_3$ is 0.01 to 0.05 mol per mol of the main component, and the amount of $Mn_2O_3$ is 0.01 to 0.05 mol per mol of the main component.

According to another aspect of the present invention, a piezoelectric device comprises the piezoelectric ceramic composition as described above, and specifically is used for a piezoelectric ceramic filter, a piezoelectric ceramic oscillator, and various sensors.

Furthermore, the piezoelectric device such as a piezoelectric ceramic oscillator and a piezoelectric ceramic filter including a piezoelectric oscillating part and an additional capacitive part as one unit is formed of the piezoelectric ceramic composition as described above.

As described above, the piezoelectric ceramic composition of the present invention suppresses the change in the resonance frequency due to heat shock and the drift thereafter, and thus provides better piezoelectric properties than those of a conventional piezoelectric ceramic composition. More specifically, the changes in the resonance frequency and the capacitance are small when comparing those measured before a heat treatment to those measured thereafter. Thus, the present invention provides a piezoelectric ceramic composition having excellent heat resistance. This piezoelectric ceramic composition has only a small change over time in the characteristics, even if a heat treatment is performed at 250° C. for a short period. Therefore, it is particularly useful in view of the quality control in the production process.

Furthermore, the piezoelectric ceramic composition of the present invention provides a piezoelectric device having excellent heat resistance. A piezoelectric ceramic filter produced with the piezoelectric ceramic composition of the present invention has excellent heat resistance so that the shift in the characteristics of the frequency dependence of the filter is small when comparing those before and after a heat treatment.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples with reference to the accompanying drawings.

EXAMPLE 1

Figure 1:
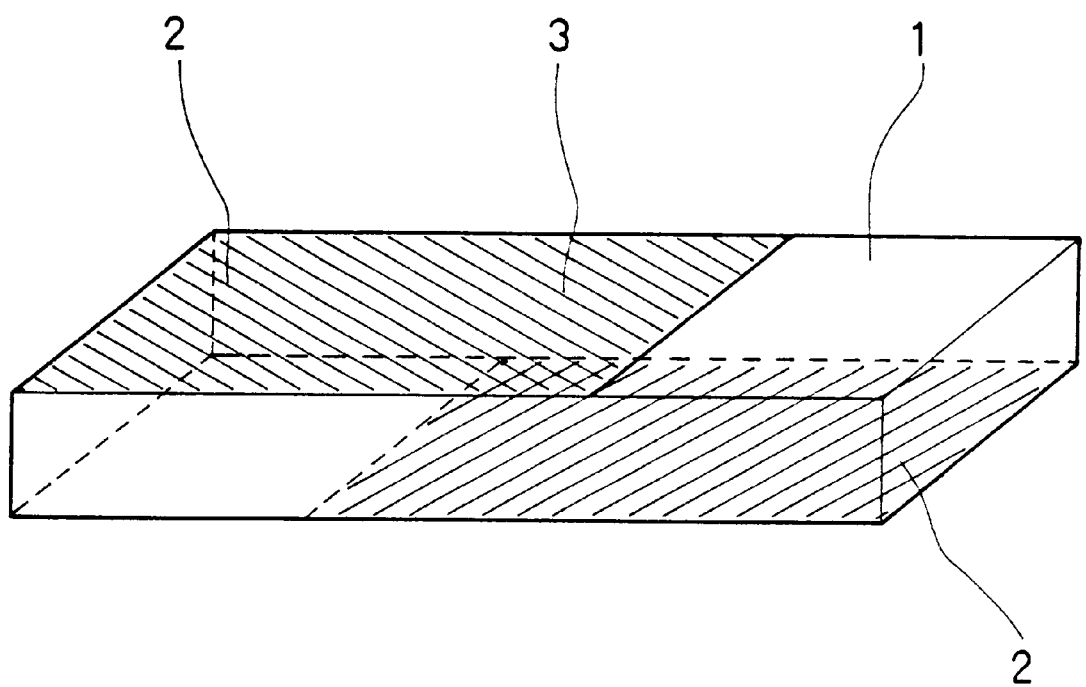
FIG. 1 is a perspective view showing a piezoelectric resonator in the thickness-shear mode of one embodiment of the present invention.

PbO, $Y_2O_3$, $MnCO_3$, $TiO_2$ and $ZrO_2$ were used as starting materials and weighed in a predetermined proportion so that a composition ratio of x, a, and d in $(1-x)PbTi_{1-a}Zr_aO_3$—$xYMn_dO_{1+2d}$ ($0 < x \leq 0.045$, $0.529 \leq a \leq 0.538$, $0.5 \leq d \leq 3.2$) is in accordance with that shown in Table 1. The material powders were mixed in a ball mill and calcined at 750 to 900° C. for 2 hours. The material powder was ground in a ball mill again, and the obtained powder was compressed and molded into a disk-shaped compressed body having a diameter of 13 mm and a thickness of 1 mm. The compressed body was sintered at 1140 to 1260° C. for 2 hours. The obtained ceramic was polished so as to have a thickness of 0.3 mm. Thereafter, electrodes were fabricated by vacuum evaporation of Cr—Au on both surfaces of the ceramic. This element was polarized by applying a direct electric field of 4 kV/mm between the electrodes in silicone oil at 100° C. for 30 min. Then, the polarized electrodes were removed, and partial electrodes were formed of Cr—Au so as to obtain an energy trapping type resonator as shown in FIG. 1. The resonator shown in FIG. 1 includes a piezoelectric ceramic 1, electrodes 2 and an oscillating part (resonant part) 3.

This sample was placed in an oven at 250° C. for 10 minutes, and the changes due to a heat treatment in the resonance frequency, the antiresonant frequency, and the capacitance were measured with an impedance analyzer. Thus, various properties (dielectric constant, dielectric loss tangent, electromechanical coupling coefficient, mechanical quality factor) were obtained. Table 1 shows the results.

TABLE 1

$(1 - x)PbTi_{1-a}Zr_aO_3 - xYMn_dO_{1+2d}$

| Sample No. | x | d | a | $\epsilon_{33}^T/\epsilon_0$ | tan δ | $k_p$ | $k_{15}$ | $k_t$ | $Q_m$ |
|---|---|---|---|---|---|---|---|---|---|
| 1 | 0.015 | 1.0 | 0.529 | 931.6 | 0.0127 | 0.570 | 0.634 | 0.482 | 587 |
| 2 | 0.015 | 1.0 | 0.532 | 853.7 | 0.0124 | 0.570 | 0.624 | 0.490 | 606 |
| 3 | 0.015 | 1.0 | 0.535 | 747.5 | 0.0120 | 0.564 | 0.631 | 0.491 | 626 |
| 4 | 0.015 | 1.0 | 0.538 | 646.9 | 0.0119 | 0.553 | 0.622 | 0.501 | 629 |
| 5 | 0.015 | 0.7 | 0.535 | 715.1 | 0.0064 | 0.579 | 0.631 | 0.508 | 840 |
| 6 | 0.015 | 1.4 | 0.535 | 768.5 | 0.0183 | 0.541 | 0.610 | 0.483 | 483 |
| 7 | 0.010 | 1.6 | 0.535 | 638.2 | 0.0109 | 0.554 | 0.631 | 0.498 | 636 |
| 8 | 0.020 | 0.7 | 0.535 | 855.5 | 0.0131 | 0.565 | 0.621 | 0.515 | 450 |
| 9 | 0.015 | 1.4 | 0.532 | 797.1 | 0.0003 | 0.542 | 0.612 | 0.479 | 537 |
| 10 | 0.015 | 1.8 | 0.532 | 819.7 | 0.0236 | 0.526 | 0.608 | 0.468 | 419 |
| 11 | 0.015 | 2.1 | 0.532 | 835.4 | 0.0262 | 0.520 | 0.615 | 0.470 | 383 |
| 12 | 0.015 | 1.4 | 0.529 | 905.9 | 0.0183 | 0.539 | 0.622 | 0.480 | 497 |
| 13 | 0.015 | 1.8 | 0.529 | 870.2 | 0.0236 | 0.521 | 0.615 | 0.463 | 411 |
| 14 | 0.015 | 3.0 | 0.529 | 881.5 | 0.0267 | 0.510 | 0.613 | 0.459 | 375 |
| 15 | 0.015 | 1.4 | 0.534 | 827.5 | 0.0185 | 0.540 | 0.621 | 0.476 | 467 |
| 16 | 0.040 | 0.5 | 0.535 | 895.6 | 0.0208 | 0.547 | 0.624 | 0.492 | 423 |
| *17 | 0.015 | 3.2 | 0.529 | 902.0 | 0.0450 | 0.492 | 0.562 | 0.445 | 280 |
| *18 | 0.045 | 0.5 | 0.535 | 898.2 | 0.0250 | 0.486 | 0.551 | 0.440 | 431 |

The compositions of samples 1 to 16 have a large coupling coefficient $k_{15}$ and a large mechanical quality factor ($Q_m$) of 370 to 840. On the other hand, the compositions of samples 17 and 18, which are marked with *, have small coupling coefficients, and thus poor characteristics.

Figure 2:
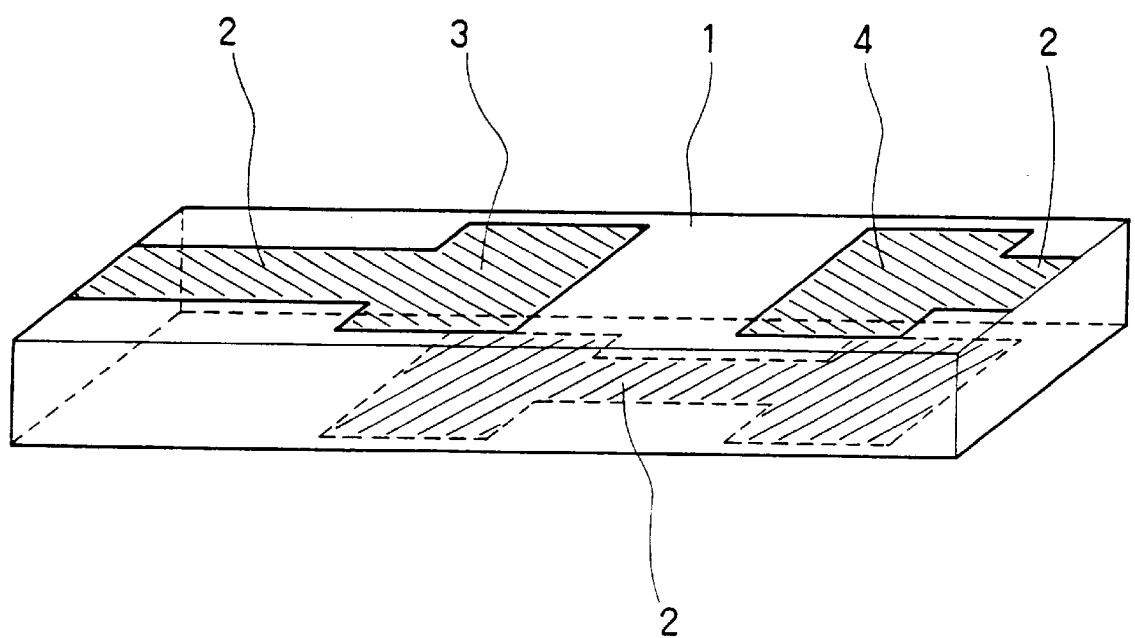
FIG. 2 is a perspective view showing a piezoelectric ceramic filter in the thickness-shear mode of one embodiment of the present invention.

Furthermore, a Cr—Au electrode was formed to obtain an energy trapping type piezoelectric device including an additional capacitive part 4 in addition to the oscillating part (resonant part) 3, as shown in FIG. 2. The characteristics of this sample at temperatures between −20 to 80° C. were evaluated. Furthermore, the heat resistance of the sample was tested by measuring the characteristics before and after the heat treatment in which the sample was placed in an oven at 250° C. for 10 minutes so as to evaluate the change. As a result, the frequency stability of the piezoelectric device formed of the piezoelectric ceramic composition of the present invention is better than that of a piezoelectric device formed of a conventional material, because the change in the frequency was smaller than that of a conventional material. Thus, the present invention provides a piezoelectric device having excellent heat resistance.

EXAMPLE 2

PbO, ZnO, NiO, MgO, $Nb_2O_5$, $ZrO_2$, $TiO_2$, $Y_2O_3$, $Er_2O_3$, $Ho_2O_3$, $Tm_2O_3$, $Lu_2O_3$, $Yb_2O_3$, and $Mn_3O_4$ were used as starting materials with $Fe_2O_3$, $Cr_2O_3$, CoO, CuO, and $SnO_2$ added, if necessary. These oxides were weighed so as to have composition ratios shown in Tables 2 to 4. The material powders were mixed in a ball mill and calcined at 750 to 900° C. for 2 hours. The material powder was ground in a ball mill again, and the obtained powder was compressed and molded into a disk-shaped compressed body having a diameter of 13 mm and a thickness of 1 mm. The compressed body was sintered at 1140 to 1260° C. for 2 hours. The obtained ceramic was polished so as to have a thickness of 0.3 mm. Thereafter, electrodes were fabricated by vacuum evaporation of Cr—Au on both surfaces of the ceramic. This element was polarized by applying a direct electric field of 5 kV/mm between the electrodes in silicone oil at 100° C. for 30 min. Then, the polarized electrodes were partially removed so that partial electrodes were formed of Cr—Au. Thus, an energy trapping type resonator was obtained.

This sample was placed in an oven at 250° C. for 10 minutes, and the resonance frequency, the antiresonant frequency, and the capacitance were measured with an impedance analyzer before and after the heat treatment so as to obtain change ratios. Tables 2 to 4 show the results.

TABLE 2

$(1 - x)Pb(Zn_{1/2}Nb_{2/3})_aZr_bO_3 - xYMnO_3$

| Sample No. | x | a | b | c | fr Change Ratio (%) | Capacitance Change Ratio (%) | k' |
|---|---|---|---|---|---|---|---|
| **1 | 0 | 0 | 0.53 | 0.47 | 0.98 | −8.4 | 0.34 |
| 2 | 0.01 | 0 | 0.53 | 0.47 | 0.09 | −2.6 | 0.33 |
| 3 | 0.02 | 0 | 0.53 | 0.47 | 0.06 | −0.8 | 0.32 |
| 4 | 0.04 | 0 | 0.535 | 0.465 | 0.04 | −0.9 | 0.32 |
| 5 | 0.1 | 0 | 0.54 | 0.46 | 0.06 | −1.1 | 0.26 |
| *6 | 0.15 | 0 | 0.545 | 0.455 | 0.22 | −1.3 | 0.18 |
| 7 | 0.02 | 0.01 | 0.52 | 0.47 | 0.05 | −0.5 | 0.34 |
| 8 | 0.02 | 0.02 | 0.515 | 0.465 | 0.05 | −0.6 | 0.34 |
| 9 | 0.02 | 0.05 | 0.51 | 0.44 | 0.08 | −0.7 | 0.31 |
| 10 | 0.02 | 0.1 | 0.49 | 0.41 | 0.02 | −1.5 | 0.3 |
| *11 | 0.02 | 0.15 | 0.48 | 0.37 | 0.4 | −2.9 | 0.26 |
| 12 | 0.02 | 0 | 0.7 | 0.3 | 0.04 | −0.5 | 0.22 |
| 13 | 0.02 | 0 | 0.2 | 0.8 | 0.04 | −0.4 | 0.21 |
| 14 | 0.02 | 0 | 0 | 1 | 0.04 | −0.3 | 0.26 |

TABLE 3

$(1 - x)Pb(Zn_{1/3}Nb_{2/3})_aZr_bTi_cO_3 - xYMnO_3$

| Sample No. | x | a | b | c | Additional component | fr Change Ratio (%) | Capacitance Change Ratio (%) | k' |
|---|---|---|---|---|---|---|---|---|
| 15 | 0.02 | 0 | 0.535 | 0.465 | 0.2 wt % $Fe_2O_3$ | 0.04 | −0.4 | 0.36 |
| 16 | 0.02 | 0 | 0.535 | 0.465 | 0.2 wt % $Cr_2O_3$ | 0.03 | −0.3 | 0.35 |

TABLE 3-continued $(1 - x)Pb(Zn_{1/3}Nb_{2/3})_aZr_bTi_cO_3 - xYMnO_3$

| Sample No. | x | a | b | c | Additional component | fr Change Ratio (%) | Capacitance Change Ratio (%) | k' |
|---|---|---|---|---|---|---|---|---|
| 17 | 0.02 | 0 | 0.535 | 0.465 | 0.6 wt % CoO | 0.04 | −0.4 | 0.35 |
| 18 | 0.02 | 0 | 0.535 | 0.465 | 0.05 wt % CuO | 0.04 | −0.4 | 0.34 |
| 19 | 0.02 | 0 | 0.535 | 0.465 | 0.3 wt % SnO$_2$ | 0.05 | −0.4 | 0.34 |

TABLE 4

$(1 - x)Pb(M_{1/3}Nb_{2/3})_aZr_bTi_cO_3 - xRMnO_3$

| Sample No. | M | R | x | a | b | c | fr Change Ratio (%) | Capacitance Change Ratio (%) | k' |
|---|---|---|---|---|---|---|---|---|---|
| 20 | Mg | Y  | 0.02 | 0.02 | 0.515 | 0.465 | 0.09 | −0.6 | 0.35 |
| 21 | Mg | Y  | 0.02 | 0.1  | 0.49  | 0.41  | 0.12 | −0.9 | 0.37 |
| 22 | Ni | Y  | 0.02 | 0.02 | 0.515 | 0.465 | 0.08 | −0.7 | 0.35 |
| 23 | Ni | Y  | 0.02 | 0.1  | 0.49  | 0.41  | 0.15 | −1.1 | 0.37 |
| 24 | Zn | Er | 0.02 | 0.02 | 0.515 | 0.465 | 0.07 | −0.7 | 0.35 |
| 25 | Zn | Ho | 0.02 | 0.02 | 0.515 | 0.465 | 0.08 | −0.9 | 0.36 |
| 26 | Ni | Tm | 0.02 | 0.02 | 0.515 | 0.465 | 0.07 | −0.6 | 0.35 |
| 27 | Zn | Lu | 0.02 | 0.02 | 0.515 | 0.465 | 0.09 | −0.8 | 0.34 |
| 28 | Zn | Yb | 0.02 | 0.02 | 0.51  | 0.47  | 0.1  | −0.6 | 0.35 |

In Tables 2 to 4, the fr change ratio and the capacitance change ratio refer to change ratios of the resonance frequency (fr) and the capacitance (C) at the time when 24 hours have passed since the heat treatment on the basis of those at the time when 30 minutes have passed since the heat treatment, respectively. An apparent coupling coefficient k' is calculated according to the following equation with values of the resonance frequency (fr) and antiresonant frequency (fa) measured at the time when 24 hours have passed since the heat treatment.

$$k'^2 = (fa^2 - fr^2)/fa^2$$

Sample 1 marked with ** in Table 2 is a conventional piezoelectric ceramic composition not containing a metal element R nor Mn. As seen from Tables 2 to 4, other piezoelectric ceramic compositions containing a metal element R and Mn provide piezoelectric devices with smaller resonance frequency change ratios and smaller capacitance change ratios than those of sample 1.

However, sample 6 marked with * in Table 2 has a content rate x of YMnO$_3$ of 0.15, which is relatively large, and has a better resonance frequency change ratio and a better capacitance change ratio than those of sample 1. However, the apparent coupling coefficient k' is lower. Thus, a content rate x is preferably smaller than 0.15, more specifically, preferably 0.01 to 0.1, and more preferably 0.015 to 0.05.

Similarly, sample 11 marked with * in Table 2 has a content rate a of Zn and Nb of 0.15, which is relatively large. This sample has a lower resonance frequency change ratio and a lower capacitance change ratio than those of sample 1, but is not so low as those of other samples. Thus, a content rate a is preferably smaller than 0.15, more specifically, preferably 0 to 0.1.

Furthermore, as shown in Table 3, when any one of Fe$_2$O$_3$, Cr$_2$O$_3$, CoO, CuO, and SnO$_2$ was added to 0.98PbZr$_{0.535}$Ti$_{0.465}$O$_3$–0.02YMnO$_3$, the heat resistance and the stability were further improved. The amount of an added oxide shown in Table 2 is represented by the ratio (wt %) of the weight of the added oxide to that of the whole composition. Fe, Cr, Co, Cu or Sn is preferably added in an amount so that the amount of each oxide thereof is 0.01 to 1.3wt %, most preferably 0.05 to 0.6wt %.

Furthermore, as shown in Table 4, when Zn is replaced by Mg or Ni, the heat resistance was improved. Thus, a piezoelectric device formed of a composition comprising a bivalent metal element that forms a composite perovskite instead of Zn has the same level of heat resistance and stability as a composition comprising Zn.

Furthermore, as shown in Table 4, when Y is replaced by Er, Ho, Tm, Lu or Yb, the heat resistance was improved. Thus, a piezoelectric device formed of a composition comprising a trivalent rare earth element instead of Y has an improved heat resistance and stability. This advantage is believed to result from the fact that Y or a trivalent rare earth element readily forms a manganite compound represented by RMnO$_3$ with Mn.

The piezoelectric ceramic composition of the present invention is not limited to the above-described embodiments. For example, a trace amount of impurity or additive may be present, as long as it does not prevent the object of the present invention from being achieved.

EXAMPLE 3

Figure 3:
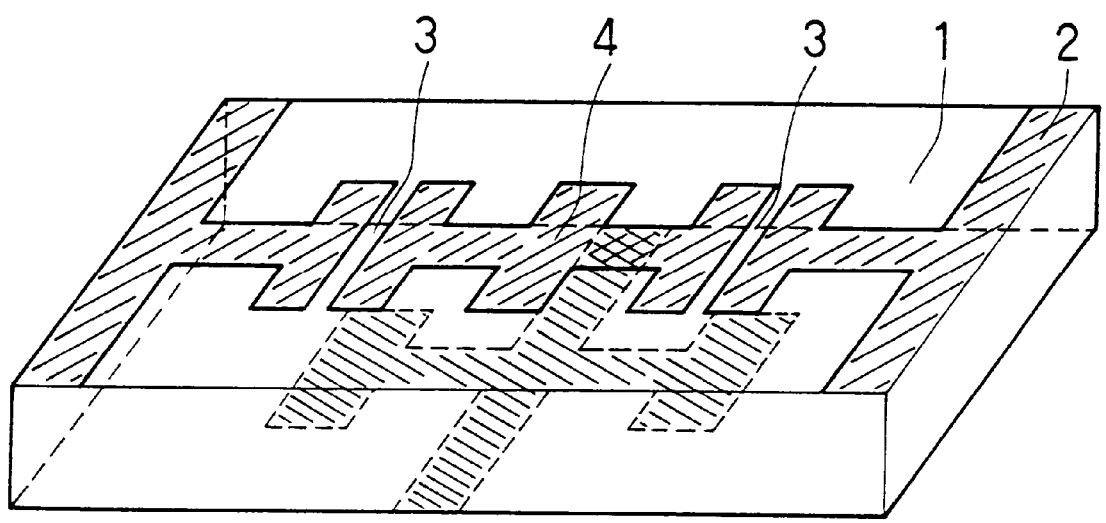
FIG. 3 is a perspective view showing a piezoelectric ceramic filter in the thickness-extension mode of one embodiment of the present invention.

The same oxides as in Example 2 were used as starting materials and weighed so as to have a composition ratio of (1−x)PbZr$_b$Ti$_c$O$_3$—xYMnO$_3$ (0.01≦x≦0.1, 0.46≦b≦0.49, 0.51≦c≦0.54, b+c=1). Furthermore, Cr$_2$O$_3$ was added in an amount of 0.2wt % with respect to (1−x)PbZr$_b$Ti$_c$O$_3$—xYMnO$_3$. These materials were mixed in a ball mill and calcined at 850° C. for 2 hours. The calcined powder was ground in a ball mill again, and the obtained powder was molded into a rectangular sheet having a size of 7×3 mm and a thickness of 1 mm. The sheet was sintered at 1170° C. for 2 hours. After sintering, the obtained ceramic was polished so as to have a thickness of 0.2 mm. Thereafter, electrodes were fabricated by vacuum evaporation of Cr—Au on both surfaces of the ceramic. This element was polarized by applying a direct electric field of 5 kV/mm between the electrodes in silicone oil at 100° C. for 30 min, and then subjected to a heat treatment at 300° C. for 30 minutes. Then, the polarized electrodes were partially removed so that Cr and Au were formed on a surface of a piezoelectric ceramic 1 to act as electrodes 2 and an additional capacitive part (unpolarized part) 4 so as to form oscillating parts (resonant parts) 3. Thus, an energy trapping type filter as shown in FIG. 3 was obtained.

This filter was placed in an oven at 250° C. for 10 minutes, and the changes in the characteristics of the frequency dependence of the filter caused by this heat treatment were measured. As a result, it was confirmed that the characteristics of the frequency dependence of the piezoelectric ceramic of the present invention using the above-described ceramic composition do not change significantly due to the heat treatment, compared with that with a conventional composition such as sample 1 in Table 2.

The piezoelectric device of the present invention is not limited to the above-described embodiments. For example, the present invention can apply to various elements formed of a piezoelectric ceramic composition, such as an oscillator, a resonator, piezoelectric sensors, a piezoelectric actuator, or a piezoelectric transducer. In order to obtain large piezoelectricity, for example, x, b and c in $(1-x)PbZr_bTi_cO_3-xYMnO_3$ are preferably in the ranges: $0.01 \leq x \leq 0.03$, $0.52 \leq b \leq 0.54$, $0.46 \leq c \leq 0.48$, which is in the vicinity of the morphotropic phase boundary, although it is not limited to thereto.

EXAMPLE 4

$Pb_3O_4$, $TiO_2$, $ZrO_2$, $Nb_2O_5$, $SnO_2$, $ZnO$, $NiO$ and $MgO$, and $MnCO_3$, $Y_2O_3$, $Dy_2O_3$, $Er_2O_3$, $Ho_2O_3$, and $Yb_2O_3$ were used as starting material powders. $Pb_3O_4$, $TiO_2$, $ZrO_2$, $Nb_2O_5$, $SnO_2$, $ZnO$, $NiO$, and $MgO$ were weighed so that $Pb(A, Nb)_xZr_yTi_{1-x-y}O_3$ (where A is at least one metal element selected from the group consisting of Sn, Zn, Ni and Mg) could have a composition ratio shown in Table 5. $MnCO_3$, $Y_2O_3$, $Dy_2O_3$, $Er_2O_3$, $Ho_2O_3$, and $Yb_2O_3$ were weighed so that $Mn_2O_3$ and $R_2O_3$ (where R is at least one metal element selected from the group consisting of Y, Dy, Er, Ho and Yb) could have composition ratios shown in Table 5 with respect to $Pb(A, Nb)_xZr_yTi_{1-x-y}O_3$. Thereafter, pure water was mixed with these components, and the mixture was further mixed in a ball mill for 17 hours. The mixed powder was dried, and the dried powder was calcined at 750 to 900° C. Then, the powder was ground with a ball mill again for 15 hours, and the obtained powder (having an average particle size of 1.0 to 1.7 μm) was molded into a disk-shaped body having a diameter of 13 mm and a thickness of 1 mm. The molded body was sintered at 1140 to 1260° C. for 1 hour. After sintering, the obtained ceramic was polished so as to have a thickness of 0.3 mm. Thereafter, electrodes were fabricated by vacuum evaporation of Cr—Au on both surfaces of the ceramic. Then, this element was polarized by applying a direct electric field of 3 kV/mm between the electrodes in silicone oil at 150° C. for 30 min. The resonance frequency (fr) and the antiresonant frequency (fa) of this sample were measured after a heat treatment at 150° C. for 30 minutes, and compared to those measured before the heat treatment. Table 5 shows the results of samples 1 to 29.

TABLE 5

$Pb(A, Nb)_xZr_yTi_{1-x-y}O_3 + aMn_2O_3 + bY_2O_3 + cDy_2O_3 + dEr_2O_3 + eHo_2O_3 + fYb_2O_3$

| Sam. No. | A | x | y | a | b | c | d | e | f | Sinter temperature [° C.] | $k_t$ | fr Change ratio (%) from pre-heat treatment 20 min. later | fr Change ratio (%) from pre-heat treatment 24 hr. later | fa Change ratio (%) from pres-heat treatment 20 min. later | fa Change ratio (%) from pres-heat treatment 24 hr. later |
|---|---|---|---|---|---|---|---|---|---|---|---|---|---|---|---|
| * 1 | — | 0 | 0.53 | 0 | 0 | 0 | 0 | 0 | 0 | 1260 | 0.35 | −1.190 | −0.440 | −1.120 | −0.430 |
| 2 | — | 0 | 0.53 | 0.01 | 0.01 | 0 | 0 | 0 | 0 | 1200 | 0.51 | −0.080 | 0.100 | 0.009 | 0.096 |
| 3 | — | 0 | 0.53 | 0.02 | 0.02 | 0 | 0 | 0 | 0 | 1170 | 0.50 | 0.009 | 0.038 | 0.025 | −0.001 |
| 4 | — | 0 | 0.53 | 0.03 | 0.03 | 0 | 0 | 0 | 0 | 1200 | 0.43 | 0.011 | 0.009 | 0.028 | 0.001 |
| 5 | — | 0 | 0.53 | 0.05 | 0.05 | 0 | 0 | 0 | 0 | 1140 | 0.39 | 0.021 | 0.011 | 0.033 | 0.009 |
| * 6 | — | 0 | 0.53 | 0.06 | 0.06 | 0 | 0 | 0 | 0 | 1140 | 0.33 | 1.000 | 0.230 | 1.840 | 0.196 |
| * 7 | — | 0 | 0.20 | 0.02 | 0.02 | 0 | 0 | 0 | 0 | | | The sinters were not dense. | | | |
| 8 | — | 0 | 0.35 | 0.02 | 0.02 | 0 | 0 | 0 | 0 | 1200 | 0.45 | −0.090 | 0.095 | 0.015 | 0.087 |
| 9 | — | 0 | 0.60 | 0.02 | 0.02 | 0 | 0 | 0 | 0 | 1200 | 0.45 | 0.011 | 0.006 | 0.041 | 0.005 |
| 10 | — | 0 | 0.70 | 0.02 | 0.02 | 0 | 0 | 0 | 0 | 1200 | 0.34 | 0.019 | 0.005 | 0.044 | 0.003 |
| 11 | — | 0 | 0.80 | 0.02 | 0.02 | 0 | 0 | 0 | 0 | 1200 | 0.33 | 0.022 | 0.006 | 0.055 | 0.004 |
| * 12 | — | 0 | 0.95 | 0.02 | 0.02 | 0 | 0 | 0 | 0 | 1200 | 0.30 | 0.993 | 0.555 | 0.101 | 0.346 |
| 13 | — | 0 | 0.53 | 0.02 | 0 | 0.02 | 0 | 0 | 0 | 1170 | 0.50 | 0.009 | 0.019 | 0.020 | 0.001 |
| 14 | — | 0 | 0.53 | 0.02 | 0 | 0 | 0.02 | 0 | 0 | 1170 | 0.49 | 0.008 | 0.018 | 0.023 | 0.002 |
| 15 | — | 0 | 0.53 | 0.02 | 0 | 0 | 0 | 0.02 | 0 | 1170 | 0.48 | 0.009 | 0.027 | 0.030 | 0.003 |
| 16 | — | 0 | 0.53 | 0.02 | 0 | 0 | 0 | 0 | 0.02 | 1170 | 0.49 | 0.007 | 0.033 | 0.019 | 0.003 |
| 17 | — | 0 | 0.53 | 0.02 | 0.01 | 0.01 | 0 | 0 | 0 | 1200 | 0.49 | 0.021 | 0.009 | 0.041 | 0.026 |
| 18 | — | 0 | 0.53 | 0.02 | 0 | 0.01 | 0.01 | 0 | 0 | 1200 | 0.48 | 0.008 | 0.019 | 0.020 | 0.015 |
| 19 | — | 0 | 0.53 | 0.02 | 0 | 0 | 0.01 | 0.01 | 0 | 1200 | 0.50 | 0.031 | 0.011 | 0.031 | 0.022 |
| 20 | — | 0 | 0.53 | 0.02 | 0 | 0 | 0 | 0.01 | 0.01 | 1200 | 0.48 | 0.029 | 0.010 | 0.044 | 0.030 |
| 21 | — | 0 | 0.53 | 0.02 | 0.01 | 0 | 0.01 | 0 | 0 | 1200 | 0.45 | 0.029 | 0.019 | 0.045 | 0.004 |
| 22 | — | 0 | 0.53 | 0.02 | 0.01 | 0 | 0 | 0.01 | 0 | 1200 | 0.46 | 0.011 | 0.021 | 0.041 | 0.021 |
| 23 | — | 0 | 0.53 | 0.02 | 0.01 | 0 | 0 | 0 | 0.01 | 1200 | 0.50 | 0.015 | 0.020 | 0.044 | 0.049 |
| 24 | — | 0 | 0.53 | 0.02 | 0.01 | 0.01 | 0.01 | 0.01 | 0.01 | 1200 | 0.38 | 0.025 | 0.016 | 0.055 | 0.050 |
| 25 | Sn | 0.05 | 0.53 | 0.02 | 0.02 | 0 | 0 | 0 | 0 | 1260 | 0.45 | 0.023 | 0.021 | 0.055 | 0.050 |
| 26 | Zn | 0.05 | 0.53 | 0.02 | 0.02 | 0 | 0 | 0 | 0 | 1260 | 0.45 | 0.011 | 0.009 | 0.059 | 0.045 |
| 27 | Ni | 0.05 | 0.53 | 0.02 | 0.02 | 0 | 0 | 0 | 0 | 1260 | 0.44 | 0.012 | 0.011 | 0.043 | 0.041 |
| 28 | Mg | 0.05 | 0.53 | 0.02 | 0.02 | 0 | 0 | 0 | 0 | 1260 | 0.43 | 0.025 | 0.023 | 0.047 | 0.044 |
| * 29 | Sn | 0.10 | 0.53 | 0.02 | 0.02 | 0 | 0 | 0 | 0 | | | The sinters were not dense. | | | |

As seen from Table 5, when a subsidiary component of $Mn_2O_3$ and $R_2O_3$ (where R is at least one metal element selected from the group consisting of Y, Dy, Er, Ho, and Yb) is added to a main component expressed by a general formula: $Pb(A, Nb)_xZr_yTi_{1-x-y}O_3$ (where $0 \leq x \leq 0.05$, $0.35 \leq y \leq 0.80$, and A is at least one metal element selected from the group consisting of Sn, Zn, Ni and Mg), the change ratios of the resonance frequency and the antiresonant frequency and the drift thereafter for the obtained piezoelectric ceramic compositions are significantly smaller than those of a piezoelectric ceramic composition not comprising the subsidiary component of $Mn_2O_3$ and $R_2O_8$ (sample 1). Moreover, the compositions are better than samples marked with * other than sample 1 in Table 5.

The same effect was provided when a composite oxide comprising two or more metal elements A, such as $Pb(Zn_{1/6}Sn_{1/6}Nb_{2/3})_{0.03}Zr_{0.53}Ti_{0.41}O_3$, was used.

EXAMPLE 5

$Pb_3O_4$, $TiO_2$, $ZrO_2$, $Nb_2O_5$, $SnO_2$, $ZnO$, $NiO$, and $MgO$ were used as starting material powders and weighed so that $Pb(A, Nb)_xZr_yTi_{1-x-y}O_3$ (where A is at least one metal element selected from the group consisting of Sn, Zn, Ni and Mg) could have a composition ratio shown in Table 6. Then, pure water was mixed thereto, and the mixture was further mixed in a ball mill for 17 hours. Similarly, $MnCO_3$, $Y_2O_3$, $Dy_2O_3$, $Er_2O_3$, $Ho_2O_3$, and $Yb_2O_3$ were used as starting material powders and weighed so that $RMnO_3$ (where R is at least one metal element selected from the group consisting of Y, Dy, Er, Ho and Yb) could have a composition ratio shown in Table 6. Then, pure water was mixed thereto, and the mixture was further mixed in a ball mill for 17 hours. Each mixed powder was dried, and the dried powders were calcined at 750 to 900° C. separately from the other. Then, $RMnO_3$ (where R is at least one metal element selected from the group consisting of Y, Dy, Er, Ho and Yb) as a subsidiary component was added in a predetermined amount to the main component, $Pb(A, Nb)_xZr_yTi_{1-x-y}O_3$ (where A is at least one metal element selected from the group consisting of Sn, Zn, Ni and Mg). Thereafter, the powder was ground in a ball mill for 15 hours, and the obtained powder (having an average particle size of 1.0 to 1.7 μm) was molded into a disk-shaped body having a diameter of 13 mm and a thickness of 1 mm. The molded body was sintered at 1140 to 1260° C. for 1 hour. The obtained ceramic was polished so as to have a thickness of 0.3 mm. Thereafter, electrodes were fabricated by vacuum evaporation of Cr—Au on both surfaces of the ceramic. This element was polarized by applying a direct electric field of 3 kV/mm between the electrodes in silicone oil at 150° C. for 30 min. The resonance frequency (fr) and the antiresonant frequency (fa) of this sample were measured after a heat treatment at 150° C. for 30 minutes, and compared to those measured before the heat treatment Table 6 shows the results of samples 30 to 54.

TABLE 6

$Pb(A, Nb)_xZr_yTi_{1-x-y}O_3 + aRMnO_3$

| | Sam. No. | A | R | x | y | a | Sinter temperature [° C.] | $k_t$ | fr Change ratio (%) from pre-heat treatment | | fa Change ratio (%) from pre-heat treatment | |
|---|---|---|---|---|---|---|---|---|---|---|---|---|
| | | | | | | | | | 20 min. later | 24 hr. later | 20 min. later | 24 hr. later |
| * | 30 | — | — | 0 | 0.53 | 0 | 1260 | 0.35 | −1.190 | −0.440 | −1.120 | −0.430 |
| | 31 | — | Y | 0 | 0.53 | 0.02 | 1170 | 0.52 | −0.077 | 0.090 | 0.019 | 0.036 |
| | 32 | — | Y | 0 | 0.53 | 0.04 | 1140 | 0.51 | 0.023 | 0.022 | 0.025 | −0.007 |
| | 33 | — | Y | 0 | 0.53 | 0.06 | 1170 | 0.51 | 0.031 | 0.033 | 0.018 | 0.020 |
| | 34 | — | Y | 0 | 0.53 | 0.10 | 1140 | 0.41 | 0.063 | 0.050 | 0.040 | 0.031 |
| * | 35 | — | Y | 0 | 0.53 | 0.12 | 1140 | 0.33 | 1.210 | 0.240 | 1.740 | 0.201 |
| * | 36 | — | Y | 0 | 0.20 | 0.04 | | The sinters were not dense. | | | | |
| | 37 | — | Y | 0 | 0.35 | 0.04 | 1170 | 0.48 | −0.080 | 0.088 | 0.032 | 0.033 |
| | 38 | — | Y | 0 | 0.60 | 0.04 | 1170 | 0.46 | 0.021 | 0.005 | 0.029 | 0.013 |
| | 39 | — | Y | 0 | 0.70 | 0.04 | 1170 | 0.41 | 0.022 | 0.019 | 0.040 | 0.023 |
| | 40 | — | Y | 0 | 0.80 | 0.04 | 1170 | 0.35 | 0.022 | 0.006 | 0.055 | 0.004 |
| * | 41 | — | Y | 0 | 0.95 | 0.04 | 1170 | 0.31 | 1.393 | 0.335 | 0.101 | 0.345 |
| | 42 | — | Y | 0 | 0.53 | 0.04 | 1170 | 0.50 | 0.016 | 0.019 | 0.020 | 0.019 |
| | 43 | — | Y | 0 | 0.53 | 0.04 | 1140 | 0.52 | 0.020 | 0.018 | 0.053 | 0.033 |
| | 44 | — | Y | 0 | 0.53 | 0.04 | 1140 | 0.49 | 0.022 | 0.021 | 0.030 | 0.003 |
| | 45 | — | Y | 0 | 0.53 | 0.04 | 1140 | 0.50 | 0.050 | 0.041 | 0.069 | 0.041 |
| | 46 | — | Dy | 0 | 0.53 | 0.04 | 1200 | 0.51 | 0.021 | 0.009 | 0.041 | 0.026 |
| | 47 | — | Er | 0 | 0.53 | 0.04 | 1200 | 0.51 | 0.008 | 0.019 | 0.020 | 0.015 |
| | 48 | — | Ho | 0 | 0.53 | 0.04 | 1200 | 0.50 | 0.051 | 0.041 | 0.031 | 0.022 |
| | 49 | — | Yb | 0 | 0.53 | 0.04 | 1200 | 0.52 | 0.059 | 0.040 | 0.034 | 0.030 |
| | 50 | Sn | Y | 0.05 | 0.53 | 0.04 | 1260 | 0.50 | 0.012 | 0.011 | 0.035 | 0.030 |
| | 51 | Zn | Y | 0.05 | 0.53 | 0.04 | 1260 | 0.51 | 0.021 | 0.012 | 0.059 | 0.046 |
| | 52 | Ni | Y | 0.05 | 0.53 | 0.04 | 1260 | 0.52 | 0.013 | 0.018 | 0.047 | 0.041 |
| | 53 | Mg | Y | 0.05 | 0.53 | 0.04 | 1260 | 0.53 | 0.022 | 0.008 | 0.057 | 0.054 |
| * | 54 | Sn | Y | 0.10 | 0.53 | 0.04 | | The sinters were not dense. | | | | |

Herein, an oxide expressed by a general formula: $Pb(A, Nb)_xZr_yTi_{1-x-y}O_3$ (where $0 \leq x \leq 0.05$, $0.35 \leq y \leq 0.80$, and A is at least one metal element selected from the group consisting of Sn, Zn, Ni and Mg) that has been calcined beforehand is a main component of a piezoelectric ceramic composition. $RMnO_3$ (where R is at least one metal element selected from the group consisting of Y, Dy, Er, Ho, and Yb)

that has been calcined beforehand is a subsidiary component. The subsidiary component was added to the main component in an amount so that the amounts of $Mn_2O_3$ and $R_2O_3$ were in the range from 0.01 to 0.05mol per mol of the main component. Then, the mixture was sintered so as to obtain a piezoelectric ceramic composition (shown in Table 6 as samples not marked with *). As seen from Table 6, the change ratios of the resonance frequency and the antiresonant frequency and the drift after the heat treatment of the obtained piezoelectric ceramic compositions are significantly smaller. Moreover, the compositions had a high electromechanical coupling coefficient ($k_t$).

The same effect was provided when a composite oxide comprising two or more metal elements A, such as $Pb(Zn_{1/6}Sn_{1/6}Nb_{2/3})_{0.03}Zr_{0.53}Ti_{0.41}O_3$, was used.

a disk-shaped compressed body having a diameter of 13 mm and a thickness of 1 mm. The compressed body was sintered at 1170 to 1290° C. for 2 hours. After sintering, the resulting ceramic was polished so as to have a thickness of 0.3 mm. Thereafter, electrodes were fabricated by vacuum evaporation of Cr—Au on both surfaces of the ceramic. This element was polarized by applying a direct electric field of 5 kV/mm between the electrodes in silicone oil at 100° C. for 30 min. The polarized electrodes were partially removed so that Cr—Au electrodes were formed. Thus, an energy trapping type resonator was obtained. The resonator was placed in an oven at 250° C. for 10 minutes. The resonance frequency (fr), the antiresonant frequency (fa), the apparent coupling coefficient (k') and the capacitance (C) of the resonator were measured by an impedance analyzer before and after the heat treatment. Table 7 shows the results.

TABLE 7

| | Sam. No. | x | a | b | c | d | additive | fr Change Ratio (%) | Capacitance Change Ratio (%) | k' |
|---|---|---|---|---|---|---|---|---|---|---|
| | \multicolumn{10}{c}{$Pb(Y_{(1-x)/2}Mn_{x/2}Nb_{1/2})_a(Zn_{1/3}Nb_{2/3})_bZr_cTi_dO_3$ + additive} |
| * | 1 | 0 | 0 | 0 | 0.53 | 0.47 | — | 0.98 | −8.4 | 0.34 |
|   | 2 | 0.5 | 0.02 | 0 | 0.52 | 0.46 | — | 0.11 | −2.4 | 0.33 |
|   | 3 | 0.5 | 0.05 | 0 | 0.5 | 0.45 | — | 0.042 | −0.47 | 0.32 |
| * | 4 | 1 | 0.05 | 0 | 0.5 | 0.45 | — | 1.1 | −6.4 | 0.35 |
|   | 5 | 0 | 0.05 | 0 | 0.5 | 0.45 | — | 0.45 | −1.4 | 0.33 |
|   | 6 | 0.5 | 0.1 | 0 | 0.47 | 0.43 | — | 0.062 | −0.32 | 0.29 |
| * | 7 | 0.5 | 0.18 | 0 | 0.42 | 0.4 | — | 0.08 | −0.48 | 0.15 |
|   | 8 | 0.5 | 0.04 | 0.01 | 0.49 | 0.46 | — | 0.046 | −0.45 | 0.34 |
|   | 9 | 0.5 | 0.04 | 0.02 | 0.49 | 0.45 | — | 0.051 | −0.48 | 0.35 |
|   | 10 | 0.5 | 0.04 | 0.05 | 0.47 | 0.44 | — | 0.081 | −0.55 | 0.31 |
|   | 11 | 0.5 | 0.04 | 0.1 | 0.43 | 0.43 | — | 0.17 | −0.84 | 0.29 |
| * | 12 | 0.5 | 0.04 | 0.2 | 0.37 | 0.39 | — | 0.41 | −2.2 | 0.25 |
|   | 13 | 0.5 | 0.02 | 0 | 0.68 | 0.3 | — | 0.038 | −0.38 | 0.22 |
|   | 14 | 0.5 | 0.02 | 0.05 | 0.2 | 0.73 | — | 0.036 | −0.35 | 0.21 |
|   | 15 | 0.5 | 0.02 | 0.05 | 0 | 0.93 | — | 0.037 | −0.34 | 0.26 |
|   | 16 | 0.5 | 0.04 | 0.01 | 0.49 | 0.46 | 0.2 wt % $Fe_2O_3$ | 0.038 | −0.42 | 0.36 |
|   | 17 | 0.5 | 0.04 | 0.01 | 0.49 | 0.46 | 0.2 wt % $Cr_2O_3$ | 0.032 | −0.32 | 0.35 |
|   | 18 | 0.5 | 0.04 | 0.01 | 0.49 | 0.46 | 0.6 wt % CoO | 0.035 | −0.35 | 0.35 |
|   | 19 | 0.5 | 0.04 | 0.01 | 0.49 | 0.46 | 0.05 wt % CuO | 0.041 | −0.36 | 0.34 |
|   | 20 | 0.5 | 0.04 | 0.01 | 0.49 | 0.46 | 0.3 wt % $SnO_2$ | 0.04 | −0.38 | 0.34 |
| | \multicolumn{10}{c}{$Pb(Y_{(1-x)/2}Mn_{x/2}Nb_{1/2})_a(Ni_{1/3}Nb_{2/3})_bZr_cTi_dO_3$ + additive} |
|   | 21 | 0.5 | 0.04 | 0.02 | 0.49 | 0.45 | — | 0.072 | −0.58 | 0.35 |
|   | 22 | 0.5 | 0.04 | 0.09 | 0.44 | 0.43 | — | 0.18 | −0.86 | 0.37 |
| | \multicolumn{10}{c}{$Pb(Y_{(1-x)/2}Mn_{x/2}Nb_{1/2})_a(Mg_{1/3}Nb_{2/3})_bZr_cTi_dO_3$ + additive} |
|   | 23 | 0.5 | 0.04 | 0.02 | 0.49 | 0.45 | — | 0.084 | −0.52 | 0.34 |
|   | 24 | 0.5 | 0.04 | 0.09 | 0.44 | 0.43 | — | 0.018 | −0.88 | 0.36 |

EXAMPLE 6

PbO, $Y_2O_3$, ZnO, NiO, MgO, $Nb_2O_5$, $TiO_2$, $ZrO_2$, and $MnCO_3$ were used as starting materials with $Fe_2O_3$, $Cr_2O_3$, CoO, CuO, and $SnO_2$ added, if necessary. PbO, $Y_2O_3$, ZnO, NiO, MgO, $Nb_2O_5$, $TiO_2$, $ZrO_2$, and $MnCO_3$ were weighed so that $Pb(Y_{(1-x)/2}Mn_{x/2}Nb_{1/2})_a(M_{1/3}Nb_{2/3})_bZr_cTi_dO_3$ (where M is at least one metal element selected from the group consisting of Zn, Ni and Mg) could have a composition ratio shown in Table 7. Furthermore, $Fe_2O_3$, $Cr_2O_3$, CoO, CuO, or $SnO_2$ was added, if necessary, in a weight ratio shown in Table 7 with respect to $Pb(Y_{(1-x)/2}Mn_{x/2}Nb_{1/2})_a(M_{1/3}Nb_{2/3})_bZr_cTi_dO_3$. Then, these components were mixed in a ball mill and then calcined at 750 to 900° C. for 2 hours. Then, the material powder was ground with a ball mill. The obtained powder was compressed and molded into As seen from Table 7, the piezoelectric ceramic compositions not marked with * in Table 7 have smaller changes in the piezoelectric properties, when comparing those before and after the heat treatment. Thus, the heat resistance and the stability of the piezoelectric properties were better than those of a conventional piezoelectric material (sample 1).

Furthermore, a composition (sample 4) with x=1, which means that the composition does not comprise Y, does not have small capacitance change ratios.

A composition (sample 7) with a=0.18, which represents a content ratio of $Y_{(1-x)/2}Mn_{x/2}Nb_{1/2}$, has a smaller apparent coupling coefficient.

A composition (sample 12) with b=0.2, which represents a content ratio of $Zn_{1/3}Nb_{2/3}$, has a relatively large capacitance change ratio.

In $Pb(Y_{1/2}Mn_{1/2}Nb_{1/2})_{0.04}(Zn_{1/3}Nb_{2/3})_{0.01}Zr_cTi_dO_3$ (where $0 \leq c \leq 0.68$, $0.3 \leq d \leq 0.93$), the compositions having c and d in the ranges: $0.47 \leq c \leq 0.51$, and $0.44 \leq d \leq 0.48$ have relatively large piezoelectricity, and therefore preferably used as a piezoelectric ceramic material.

Furthermore, in the compositions comprising any one of $Fe_2O_3$, $Cr_2O_3$, CoO, CuO, and $SnO_2$ added to $Pb(Y_{(1-x)/2}Mn_{x/2}Nb_{1/2})_a(Zn_{1/3}Nb_{2/3})_bZr_cTi_dO_3$, the heat resistance and the stability were further improved by changing the amount of the addition so that the amount of the metal element to be substituted was adjusted.

Even if Zn is replaced by another bivalent transition metal element such as Mg and Ni, as long as the element forms a composite perovskite, the same level of heat resistance and stability will be obtained with respect to examples of conventional piezoelectric materials.

EXAMPLE 7

PbO, $Y_2O_3$, ZnO, $Nb_2O_5$, $TiO_2$, $ZrO_2$, and $MnCO_3$ were used as starting materials with $Cr_2O_3$ added. PbO, $Y_2O_3$, ZnO, $Nb_2O_5$, $TiO_2$, $ZrO_2$, and $MnCO_3$ were weighed so as to have a composition ratio of $Pb(Y_{(1-x)/2}Mn_{x/2}Nb_{1/2})_a(Zn_{1/3} Nb_{2/3})_bZr_cTi_dO_3$ (where $0 \leq x < 1.0$, $0.01 \leq a \leq 0.15$, $0 \leq b < 0.2$, $0 \leq c \leq 0.68$, $0.3 \leq d \leq 0.93$, and a+b+c+d=1). $Cr_2O_3$ was weighed so that the amount of $Cr_2O_3$ became 0.2wt % with respect to $Pb(Y_{(1-x)/2}Mn_{x/2}Nb_{1/2})_a(Zn_{1/3}Nb_{2/3})_bZr_cTi_dO_3$. Then, these components were mixed in a ball mill and then calcined at 850° C. for 2 hours. Then, the material powder was ground in a ball mill until the average particle diameter became 0.5μm or less. The obtained powder was molded into a rectangular sheet having a size of 7×3 mm and a thickness of 1 mm. The sheet was sintered at 1200° C. for 2 hours. After sintering, the resulting ceramic was polished so as to have a thickness of 0.2 mm. Thereafter, electrodes were fabricated by vacuum evaporation of Cr—Au on both surfaces of the ceramic. This element was polarized by applying a direct electric field of 5 kV/mm between the electrodes in silicone oil at 100° C. for 30 min. The polarized electrodes were partially removed so that Cr—Au electrodes were formed. Thus, an energy trapping type filter including a resonant part 3 and an additional capacitive part 4, as shown in FIG. 3, was obtained. The element was placed in an oven at 250° C. for 10 minutes. The characteristics of the frequency dependence of the filter were measured before and after the heat treatment so as to evaluate a change. As a result, the characteristics of the frequency dependence of the filter formed of the piezoelectric ceramic composition of the present invention have a smaller change in the comparison of those before and after the heat treatment than that of a conventional piezoelectric ceramic material. Thus, the present invention can provide a piezoelectric ceramic filter having excellent heat resistance.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A piezoelectric ceramic composition comprising a composite oxide represented by Formula (I) as a main component:

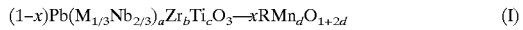

$(1-x)Pb(M_{1/3}Nb_{2/3})_aZr_bTi_cO_3 - xRMn_dO_{1+2d}$ (I)

where $0 < x \leq 0.1$, $0 \leq a \leq 0.1$, $0 \leq b \leq 0.7$, $0.3 \leq c \leq 1.0$, a+b+c=1, $0.5 \leq d \leq 3$, M is at least one metal element selected from the group consisting of Zn, Ni and Mg, and R is at least one metal element selected from the group consisting of Y, Dy, Er, Ho, Tm, Lu and Yb.

2. The piezoelectric ceramic composition according to claim 1,
wherein the $RMn_dO_{1+2d}$ in Formula (I) is contained in an amount so that an amount of an oxide of $RMnO_3$ is 1 to 10 mol % with respect to a total amount of the oxide and the composite oxide.

3. A piezoelectric ceramic composition comprising a composite oxide represented by Formula (II) as a main component:

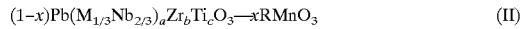

$(1-x)Pb(M_{1/3}Nb_{2/3})_aZr_bTi_cO_3 - xRMnO_3$ (II)

where $0.01 \leq x \leq 0.1$, $0 \leq a \leq 0.1$, $0 \leq b \leq 0.7$, $0.3 \leq c \leq 1.0$, a+b+c=1, M is at least one metal element selected from the group consisting of Zn, Ni and Mg, and R is at least one metal element selected from the group consisting of Y, Dy, Er, Ho, Tm, Lu and Yb.

4. A piezoelectric ceramic composition comprising a composite oxide represented by Formula (III) as a main component and a metal element R (where R is at least one metal element selected from the group consisting of Y, Dy, Er, Ho, Tm, Lu and Yb) and Mn as subsidiary components:

$Pb(A, Nb)_xZr_yTi_{1-x-y}O_3$ (III)

where $0 \leq x \leq 0.05$, $0.35 \leq y \leq 0.80$, and A is at least one metal element selected from the group consisting of Sn, Zn, Ni and Mg,
wherein the piezoelectric ceramic composition comprises the metal element R in an amount so that an amount of $R_2O_3$ is 0.01 to 0.05 mol per mol of the main component, and
the piezoelectric ceramic composition comprises Mn in an amount so that an amount of $Mn_2O_3$ is 0.01 to 0.05 mol per mol of the main component.

5. A piezoelectric ceramic composition represented by Formula (IV):

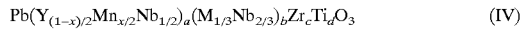

$Pb(Y_{(1-x)/2}Mn_{x/2}Nb_{1/2})_a(M_{1/3}Nb_{2/3})_bZr_cTi_dO_3$ (IV)

where $0 \leq x < 1.0$, $0.01 \leq a \leq 0.15$, $0 \leq b < 0.2$, $0 \leq c \leq 0.68$, $0.3 \leq d \leq 0.93$, a+b+c+d=1, and M is at least one metal element selected from the group consisting of Zn, Ni and Mg.

6. The piezoelectric ceramic composition according to claim 1, further comprising at least one metal element selected from the group consisting of Fe, Cr, Co, Cu and Sn in an amount so that an amount of each of $Fe_2O_3$, $Cr_2O_3$, CoO, CuO and $SnO_2$ that is present is 0.01 to 1.3wt %.

7. The piezoelectric ceramic composition according to claim 2, further comprising at least one metal element selected from the group consisting of Fe, Cr, Co, Cu and Sn in an amount so that an amount of each of $Fe_2O_3$, $Cr_2O_3$, CoO, CuO and $SnO_2$ that is present is 0.01 to 1.3 wt %.

8. The piezoelectric ceramic composition according to claim 3, further comprising at least one metal element selected from the group consisting of Fe, Cr, Co, Cu and Sn in an amount so that an amount of each of $Fe_2O_3$, $Cr_2O_3$, CoO, CuO and $SnO_2$ that is present is 0.01 to 0.3 wt %.

9. The piezoelectric ceramic composition according to claim 4, further comprising at least one metal element selected from the group consisting of Fe, Cr, Co, and Cu in an amount so that an amount of each of $Fe_2O_3$, $Cr_2O_3$, CO, and CuO that is present is 0.01 to 1.3 wt %.

10. The piezoelectric ceramic composition according to claim 5, further comprising at least one metal element selected from the group consisting of Fe, Cr, Co, Cu and Sn in an amount so that an amount of each of $Fe_2O_3$, $Cr_2O_3$, CoO, CuO and $SnO_2$ that is present is 0.01 to 1.3 wt %.

11. A method for producing a piezoelectric ceramic composition comprising the steps of:
adding a subsidiary component $RMnO_3$ (where R is at least one metal element selected from the group consisting of Y, Dy, Er, Ho, Tm, Lu and Yb) that has been calcined earlier to a main component of a composite oxide of Pb, Ti and Zr that has been calcined earlier;
mixing the main component and the subsidiary component; and
sintering the mixture.

12. A method for producing a piezoelectric ceramic composition comprising the steps of:
adding a subsidiary component $RMnO_3$ (where R is at least one metal element selected from the group consisting of Y, Dy, Er, Ho, Tm, Lu and Yb) that has been calcined earlier to a main component represented by Formula (III) that has been calcined earlier;
mixing the main component and the subsidiary component; and
sintering the mixture,
wherein in the adding step, $RMnO_3$ is added to the main component in an amount so that an amount of $R_2O_3$ is 0.01 to 0.05 mol per mol of the main component, and an amount of $Mn_2O_3$ is 0.01 to 0.05 mol per mol of the main component:

$$Pb(A, Nb)_x Zr_y Ti_{1-x-y} O_3 \quad \text{(III)}$$

where $0 \leq x \leq 0.05$, $0.35 \leq y \leq 0.80$, and A is at least one metal element selected from the group consisting of Sn, Zn, Ni and Mg.

13. A piezoelectric device comprising a piezoelectric ceramic composition containing a composite oxide represented by Formula (I) as a main component:

$$(1-x)Pb(M_{1/3}Nb_{2/3})_a Zr_b Ti_c O_3 - xRMn_d O_{1+2d} \quad \text{(I)}$$
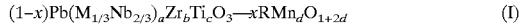

where $0 < x \leq 0.1$, $0 \leq a \leq 0.1$, $0 \leq b \leq 0.7$, $0.3 \leq c \leq 1.0$, a+b+c=1, $0.5 \leq d \leq 3$. M is at least one metal element selected from the group consisting of Zn, Ni and Mg, and R is at least one metal element selected from the group consisting of Y, Dy, Fr, Ho, Tm, Lu and Yb.

14. The piezoelectric device according to claim 13, wherein the piezoelectric device includes an oscillating part and a capacitive part as one unit.

15. A piezoelectric ceramic filter comprising a piezoelectric ceramic composition containing a composite oxide represented by Formula (I) as a main component:

$$(1-x)Pb(M_{1/3}Nb_{2/3})_a Zr_b Ti_c O_3 - xRMn_d O_{1+2d} \quad \text{(I)}$$

where $0 < x \leq 0.1$, $0 \leq a \leq 0.1$, $0 \leq b \leq 0.7$, $0.3 \leq c \leq 1.0$, a+b+c=1, $0.5 \leq d \leq 3$, M is at least one metal element selected from the group consisting of Zn, Ni and Mg, and R is at least one metal element selected from the group consisting of Y, Dy, Er, Ho, Tm, Lu and Yb.

16. The piezoelectric ceramic filter according to claim 15, wherein the piezoelectric ceramic filter includes an oscillating part and a capacitive part as one unit.

17. A piezoelectric device comprising a piezoelectric ceramic composition containing a composite oxide represented by Formula (II) as a main component:

$$(1-x)Pb(M_{1/3}Nb_{2/3})_a Zr_b Ti_c O_3 - xRMnO_3 \quad \text{(II)}$$
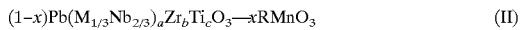

where $0.01 \leq x \leq 0.1$, $0 \leq a \leq 0.1$, $0 \leq b \leq 0.7$, $0.3 \leq c \leq 1.0$, a+b+c=1, M is at least one metal element selected from the group consisting of Zn, Ni and Mg, and R is at least one metal element selected from the group consisting of Y, Dy, Er, Ho, Tm, Lu and Yb.

18. The piezoelectric device according to claim 17, wherein the piezoelectric device includes an oscillating part and a capacitive part as one unit.

19. A piezoelectric ceramic filter comprising piezoelectric ceramic composition containing a composite oxide represented by Formula (II) as a main component:

$$(1-x)Pb(M_{1/3}Nb_{2/3})_a Zr_b Ti_c O_3 - xRMnO_3 \quad \text{(II)}$$

where $0.01 \leq x \leq 0.1$, $0 \leq a \leq 0.1$, $0 \leq b \leq 0.7$, $0.3 \leq c \leq 1.0$, a+b+c=1, M is at least one metal element selected from the group consisting of Zn, Ni and Mg, and R is at least one metal element selected from the group consisting of Y, Dy, Er, Ho, Tm, Lu and Yb.

20. The piezoelectric ceramic filter according to claim 18, wherein the piezoelectric ceramic filter includes an oscillating part and a capacitive part as one unit.

21. A piezoelectric device comprising a piezoelectric ceramic composition containing a composite oxide represented by Formula (III) as a main component and a metal element R (where R is at least one metal element selected from the group consisting of Y, Dy, Er, Ho, Tm, Lu and Yb) and Mn as subsidiary components:

$$Pb(A, Nb)_x Zr_y Ti_{1-x-y} O_3 \quad \text{(III)}$$

where $0 \leq x \leq 0.05$, $0.35 \leq y \leq 0.80$, and A is at least one metal element selected from the group consisting of Sn, Zn, Ni and Mg,
wherein the piezoelectric ceramic composition comprises the metal element R in an amount so that an amount of $R_2O_3$ is 0.01 to 0.05 mol per mol of the main component, and
the piezoelectric ceramic composition comprises Mn in an amount so that an amount of $Mn_2O_3$ is 0.01 to 0.05 mol per mol of the main component.

22. The piezoelectric device according to claim 21, wherein the piezoelectric device includes an oscillating part and a capacitive part as one unit.

23. A piezoelectric ceramic filter comprising a piezoelectric ceramic composition containing a composite oxide represented by Formula (III) as a main component and a metal element R (where R is at least one metal element selected from the group consisting of Y, Dy, Er, Ho, Tm, Lu and Yb) and Mn as subsidiary components:

$$Pb(A, Nb)_x Zr_y Ti_{1-x-y} O_3 \quad \text{(III)}$$

where $0 \leq x \leq 0.05$, $0.35 \leq y \leq 0.80$, and A is at least one metal element selected from the group consisting of Sn, Zn, Ni and Mg,
wherein the piezoelectric ceramic composition comprises the metal element R in an amount so that an amount of $R_2O_3$ is 0.01 to 0.05 mol per mol of the main component, and
the piezoelectric ceramic composition comprises Mn in an amount so that an amount of $Mn_2O_3$ is 0.01 to 0.05 mol per mol of the main component.

24. The piezoelectric ceramic filter according to claim 23, wherein the piezoelectric ceramic filter includes an oscillating part and a capacitive part as one unit.

25. A piezoelectric device comprising a piezoelectric ceramic composition represented by formula (IV):

$$Pb(Y_{(1-x)/2}Mn_{x/2}Nb_{1/2})_a(M_{1/3}Nb_{2/3})_bZr_cTi_dO_3 \quad (IV)$$

where $0 \leq x < 1.0$, $0.01 \leq a \leq 0.15$, $0 \leq b < 0.2$, $0 \leq c \leq 0.68$, $0.3 \leq d \leq 0.93$, $a+b+c+d=1$, and M is at least one metal element selected from the group consisting of Zn, Ni and Mg.

26. The piezoelectric device according to claim 25, wherein the piezoelectric device includes an oscillating part and a capacitive part as one unit.

27. A piezoelectric ceramic filter comprising a piezoelectric ceramic composition represented by Formula (IV):

$$Pb(Y_{(1-x)/2}Mn_{x/2}Nb_{1/2})_a(M_{1/3}Nb_{2/3})_bZr_cTi_dO_3 \quad (IV)$$

where $0 \leq x < 1.0$, $0.01 \leq a \leq 0.15$, $0 \leq b < 0.2$, $0 \leq c \leq 0.68$, $0.3 \leq d \leq 0.93$, $a+b+c+d=1$, and M is at least one metal element selected from the group consisting of Zn, Ni and Mg.

28. The piezoelectric ceramic filter according to claim 27, wherein the piezoelectric ceramic filter includes an oscillating part and a capacitive part as one unit.

* * * * *